United States Patent

[11] 3,626,313

[72] Inventor Paul Zuk
Allentown, Pa.
[21] Appl. No. 18,076
[22] Filed Mar. 10, 1970
[45] Patented Dec. 7, 1971
[73] Assignee Bell Telephone Laboratories, Incorporated
Murray Hill, Berkeley Heights, N.J.

[54] CLASS AB AMPLIFIER FOR MONOLITHIC INTEGRATED CIRCUIT
5 Claims, 4 Drawing Figs.

[52] U.S. Cl. .................................................. 330/40, 307/303, 330/15, 330/38 M
[51] Int. Cl. .................................................. H03f 3/14
[50] Field of Search .................................................. 330/15, 19, 22, 40, 38 M; 307/303

[56] References Cited

UNITED STATES PATENTS 3,531,730 9/1970 Steckler ...................... 330/38 X
3,418,592 12/1968 Solomon et al. .............. 330/38 X

*Primary Examiner*—Roy Lake
*Assistant Examiner*—James B. Mullins
*Attorneys*—R. J. Guenther and Edwin B. Cave

ABSTRACT: A transistor amplifier circuit for class AB operation having a low current in the quiescent state but high in the amplifying state as determined by the difference in emitter areas of two of the three transistors and the magnitude of a control resistor. The current amplification thus is independent of the beta of the transistors and all transistors are of the same conductivity type.

The input branch contains a control transistor having a large area emitter connected through a control resistor to a common terminal. Also connected to the common terminal is the proportionately smaller area emitter of a current gain transistor whose collector in turn is connected to the emitter of a voltage amplitude control transistor likewise in the output branch. The bases of the control and current gain transistors are directly interconnected and bypass connection short circuits the base-collector PN junction of the current gain transistor.

INVENTOR
P. ZUK
BY H.W. Lockhart
ATTORNEY

CLASS AB AMPLIFIER FOR MONOLITHIC INTEGRATED CIRCUIT

This invention relates to a transistor amplifier circuit and, more particularly, a circuit for class AB operation suited for fabrication in monolithic integrated form.

BACKGROUND OF THE INVENTION

Amplifier circuits using transistors is integrated form are well known. Circuits designed for class AB operation typically, however, utilize complementary pairs of transistors which renders fabrication in monolithic integrated form difficult. An existing amplifier circuit of this type in which the transistors are all of like conductivity type, and hence polarity, lacks good stability and does not permit good design control of the quiescent (low current) state and of the current gain.

Accordingly, an object of this invention is a transistor amplifier circuit for class AB operation using all NPN or all PNP-transistors. Another object is a transistor amplifier circuit in which the quiescent state parameters and the current gain at the high current state are independent of the beta of the transistor and are determinable and reproducible from the initial design.

SUMMARY OF THE INVENTION

One basic configuration in accordance with the invention comprises a circuit including three transistors, all of the same conductivity type, that is, all NPN of all PNP. In a specific embodiment using NPN-type, the input branch of the circuit includes the control transistor which has its collector connected by way of an input series resistor to a first terminal at positive potential. The emitter of the control transistor is connected by way of a control resistor to a common terminal at a negative potential.

The output branch includes a current gain transistor having its emitter directly connected to the common terminal and its collector connected to the emitter of a voltage amplitude control transistor. The current gain transistor has its base directly connected to the base of the control transistor in the input branch and further has a bypass connection from collector to base thus short circuiting the base-collector PN-junction.

Finally, the voltage amplitude control transistor has its base connected to the input branch at a point between the input resistor and control transistor and has it collector connected to a second terminal at a positive potential.

There are two important aspects to the configuration of the above-described circuit, namely, the resistance value of the control resistor, and the ratio of the area of the emitter of the control transistor to the emitter area of the current gain transistor. The value of current drawn by the circuit in the quiescent or low current level state is determined substantially by the magnitude of the control resistor. On the other hand, in the high current or amplifying state the output current is larger by a factor related to the ratio of the emitter areas and varies exponentially. Thus, the circuit in accordance with this invention enables high levels of amplification while providing very low current levels in the quiescent state. Moreover, these characteristics are achieved irrespective of the beta or gain characteristics of the transistor in the circuit.

Thus, a feature of this invention is a circuit particularly suitable for integration in monolithic form inasmuch as all transistors are of like conductivity type.

BRIEF DESCRIPTION OF THE DRAWINGS

The invention and its other objects and features will be better understood from the following detailed description taken in conjunction with the drawing in which.

DETAILED DESCRIPTION

BASIC CIRCUIT CONFIGURATION —FIG. 1

Figure 1:
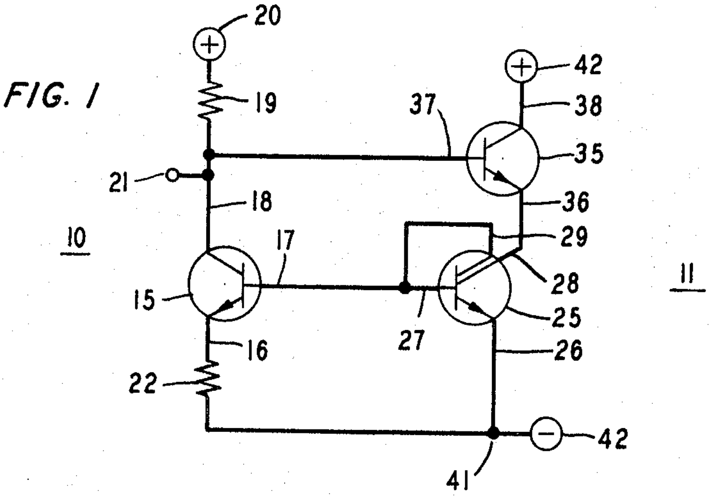
FIG. 1 is a schematic diagram of the basic circuit in accordance with the invention.

The circuit shown in FIG. 1 comprises an input branch 10 and an output branch 11. The input branch 10 includes the control transistor 15 of NPN-conductivity-type configuration with emitter connection 16, base connection 17 and collector connection 18. Collector connection 18 is connected by way of input series resistor 19 to input terminal 20 which is at a positive potential. Terminal 21 to the input branch is provided as an input reference point to the circuit.

The emitter connection 16 of the control transistor 15 is connected to the common terminal 41 which in turn is connected to negative potential terminal 42. The output branch 11 also terminates at one end at common terminal 41 and includes current gain transistor 25 and voltage amplitude control transistor 35.

As shown in the drawing, transistor 25 has emitter connection 26 connected to common terminal 41, base connection 27 directly connected to base connection 17 of control transistor 15 and collector connection 28 to emitter connection 36 of transistor 35. Bypass connection 29 connects base and collector of transistor 25 and effectively short-circuits the base-collector PN-junction. Finally, collector connection 38 of transistor 35 is directly connected to output terminal 42 at a positive potential.

In addition, importantly, the active emitter area of control transistor 15 is fabricated to be greater than the active emitter area of current gain transistor 25, in this specific embodiment by a factor of 12.

The design and operation of the circuit of FIG. 1 may be derived from the following relationships. Defining terms:

$I_o$=a constant transistor parameter $I_x$=current in control resistor 22 and emitter 16 of control transistor 15

$I_y$=current in emitter 26 of current gain transistor 25

$V_x$=voltage drop emitter-to-base of control transistor 15

$v_y$=voltage drop emitter-to-base of current gain transistor 25

$R$=resistance value of control resistor 22

$m$=ratio of area of emitter of control transistor 15 to area of emitter of current gain transistor 25

$l$=subscript denoting quiescent or low current state $$n=\frac{I_{y1}}{I_{x1}}$$

$$P=\frac{I_x}{I_{x1}}$$

Then, for the circuit of FIG. 1 the following relationships hold:

$$I_y=I_o e^{\frac{q}{kT}V_y},\quad I_x=mI_o e^{\frac{q}{kT}V_x} \qquad (1)$$

$$V_y=V_x+I_xR \qquad (2)$$

$$I_y=I_o e^{\frac{q}{kT}(V_x+I_xR)} \qquad (3)$$

Then, substituting $$I_y=\frac{I_x}{m}e^{\frac{q}{kT}I_xR} \qquad (4)$$

The current $I_x$ in the idling or low current state wherein it is noted $I_{x1}$ may be set to any desired value by choice of the resistance of input series resistor 19. Then, $$I_{y1}=\frac{I_{x1}}{m}e^{\frac{q}{kT}I_{x1}R} \qquad (5)$$

Now, by choosing the value of control resistor 22 $I_{y1}$ may be set to a desired value. Then, in operation, $I_y$ varies in accordance with equation (4) as $I_x$ is varied. $I_x$ in turn may be varied by varying the voltage at input terminal 20, by varying the input series resistor 19, or by injecting a current from another source at input reference terminal 21.

Then, using equations (4) and (5) and the terms m, n and p defined above:

$$I_y = I_x n^p m^{p-1} \quad (6)$$

In a specific embodiment in which, as previously described, $m=12$, $I_{x1}$ is set equal to 1 milliampere and $I_{y1}$ equal to $I_{x1}$, that is $n=1$. By selecting a high current state in which $I_x$ is 2 milliamperes, then $$p=2$$

and $$I_y = I_X n^p m^{p-1} = 24 \text{ milliamperes.}$$

This is an example of class AB operation in which the idling or low current state is low but the peak output current is high.

In a specific embodiment of the foregoing example, using NPN-transistors, and supply voltages of 6 volts negative at terminal 42 and from 0 to 6 volts positive at terminal 20, the control resistor 22 had a value of 79 ohms, the input series resistor a value of 4,640 ohms. It will be noted that the beta, or common-emitter current gain, of the transistors of the circuit of FIG. 1 is not a factor in the above-described characteristics. Thus, other than in the determination of the factor *m* with respect to the control transistor and the current gain transistor, the transistors are selected on the basis of their ability to withstand the prescribed voltages and currents.

FInally, voltage amplitude control transistor 35, by virtue of the base bias from a point in the input circuit functions as described by its title to cause the voltage to swing at the output 42 in accordance with that required by the external load, not shown.

PUSH-PULL OUTPUT CIRCUIT

Figure 2:
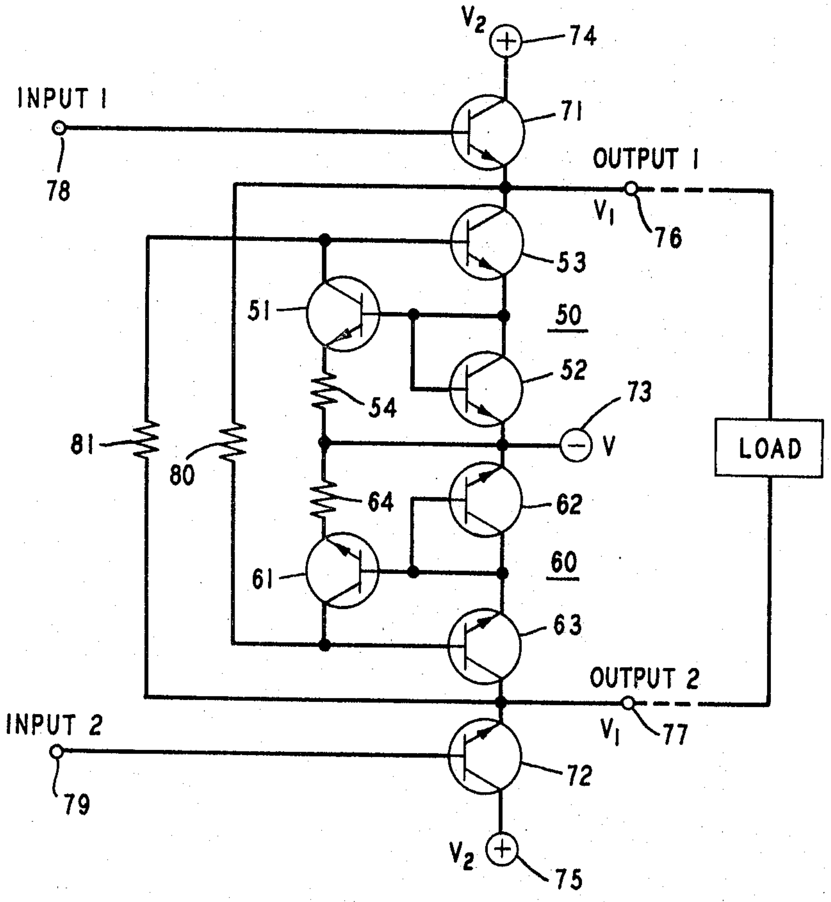
FIG. 2 is a schematic diagram of a push-pull amplifier circuit incorporating the basic circuit of FIG. 1.

In FIG. 2 a push-pull amplifier circuit is shown using a pair of the basic circuit configurations of FIG. 1. The first basic circuit 50 includes control transistor 51, control resistor 54, current gain transistor 52, and transistor 53. The second basic circuit 60 comprises control transistor 61, control resistor 64, current gain transistor 62 and transistor 63. Input series resistors 80 and 81 are cross coupled to the output terminals 76 and 77 where a voltage $V_1$ is applied. In the quiescent state this voltage at outputs 1 and 2 is midway between voltage $V_2$ at terminals 74 and 75 and negative potential V at terminal 73. As the output voltages vary the $V_1$ voltage drop across the input series resistors 80 and 81 produces an increase in $I_x$ of each basic circuit to about double, in other words, assume $p=2$ as in the previously described circuit. As the voltage on input 1, terminal 78 increases positive, transistor 71 drives output 1 positive, which also drives pulldown circuit 60, which in turn pulls output 2 negative. When input 2 has a positive voltage applied the action is mirrored in the other half of the circuit to give the other phase of the push-pull output. Thus, the circuit provides a push-pull amplified power output.

OPERATIONAL AMPLIFIER CIRCUIT

Figure 3:
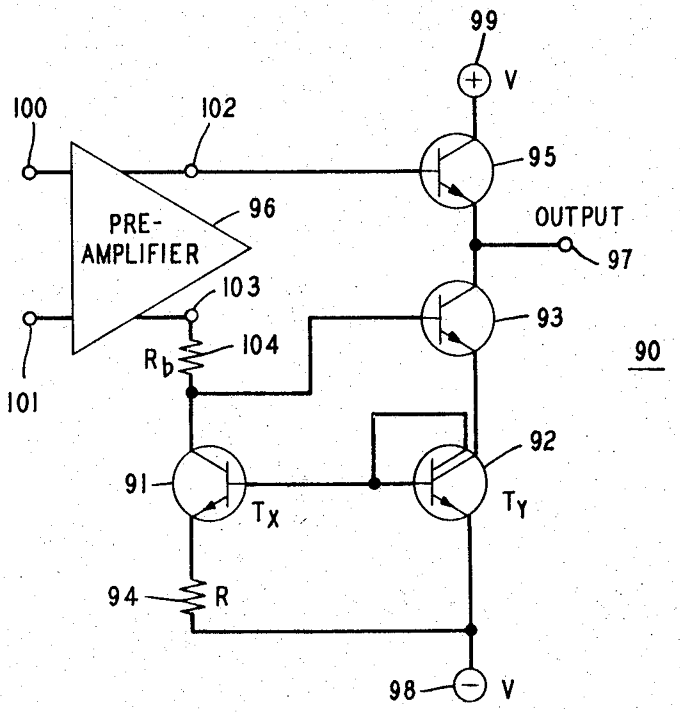
FIG. 3 is a schematic diagram of an operational amplifier incorporating the basic circuit.

FIG. 3 shown another application of the basic circuit configuration of FIG. 1. In the arrangement of FIG. 3 the push-pull output of a differential preamplifier 96 is converted to a single end output in an operational amplifier configuration. Again the circuit includes the three transistors 91, 92 and 93, control resistor 94 and input resistor 104 similar to the basic circuit configuration 90 previously described in connection with FIG. 1. Preamplifier 96 is connected to the pair of input terminals 100 and 101 and has one output connection 103 to the series resistor 104 and the other connection 102 to the base of transistor 95. Under quiescent conditions 102 and 103 are at the same potential, thus the output circuit idles at a low current as described earlier. With an input signal applied to connections 100, 101 a push-pull output appears at connections 102, 103. That is when connection 102 goes positive, connection 103 goes negative. Thus transistor 95 pulls the output 97 up while the pulldown circuit 90 is turned off. When the input signal polarity is reversed, connection 102 goes negative while connection 103 goes positive. The positive signal at connection 103 causes pulldown circuit 90 to pull the output down or negative while connection 102 also going negative turns off transistor 95. Thus, the circuit provides an operational amplifier configuration enabling class AB operation with a single-ended output at terminal 97.

EMBODIMENT OF FIG. 4

Figure 4:
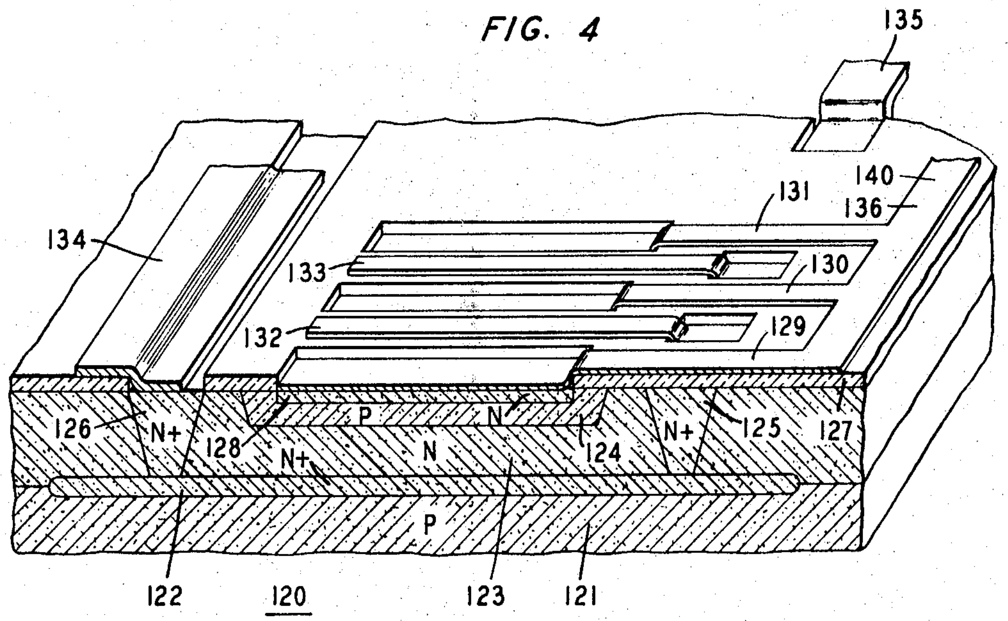
FIG. 4 is a perspective view, partially in section, of monolithic semiconductor body showing integration of two of the transistors of the basic circuit configuration.

Advantageously, the control transistor and current gain transistor, at least, are integrated in a single monolithic semiconductor body. As previously indicated, the entire basic circuit configuration, including the resistors, may comprise a single monolithic integrated circuit. Certain design parameters are matched with ease of at least the control and current gain transistors are integrated together and FIG. 4 illustrates a portion of a monolithic integrated circuit showing, in particular, the current gain transistor. Of particular note is the manner in which the bypass connection short-circuiting the base-collector PN-junction is fabricated.

Referring to FIG. 4 the monolithic semiconductor body, typically of silicon, comprises a P-type substrate 121 and an N-type epitaxially deposited layer formed thereon with the usual intervening buried collector 122 of N+material. N+ zones 125 and 126 are diffused into the epitaxial layer to define the collector zone 123 of the current gain transistor. Additional diffusions form the P-type base zone 124 and a series of N-type emitter zones 128. A silicon oxide layer 127 is provided on the surface for the usual passivating and insulating purposes. Emitter connections consist of the metallized strips 129, 130, 131 and additional similarly spaced strips not shown which are connected to bus connector 140. Base contacts comprise the strips 132, 133 and may include additional similar strips not shown which are carried across the insulating oxide film to make ohmic contact to the N+ zone 125. These contacts comprise the bypass connection from base to collector. The contact strip 135 forms the external base zone connection to the transistor. The external contact to the collector zone comprises the metallized contact 134 to N+ zone 126. Although not shown the control transistor may be placed within the same monolithic block adjoining the current gain transistor and the interconnections between elements are made by metallized strips overlying the silicon oxide film. By providing the multiple interconnections as shown in FIG. 4 for the current gain transistor, large voltage drops in the bypass connection are avoided which thereby avoids a mismatch in the base to emitter voltage which would otherwise be produced between the current gain and control transistors.

What is claimed is:

1. A transistor amplifier circuit for class AB operation including three transistors of the same conductivity type, said circuit comprising an input branch an an output branch interconnected at a common terminal for applying a voltage, said input branch including a control transistor and a control resistor, said control resistor being between said control transistor and said common terminal, the output branch including a current gain transistor and a voltage amplitude control transistor, the base electrode of the current gain transistor being directly connected to the base of the control transistor, a bypass connection from the base electrode to the collector of the current gain transistor, and the emitter area of the control transistor being larger than the emitter area of the current gain transistor by a factor *m*.

2. The transistor amplifier circuit in accordance with claim 1 in which the output branch includes in order from an output terminal the collector electrode of the voltage amplitude control transistor, the emitter electrode of the voltage amplitude control transistor, the collector electrode of the current gain transistor, and the emitter electrode of the current gain transistor.

3. The transistor amplifier circuit in accordance with claim 1 in which the input branch includes in order from an input terminal, an input series resistor, the collector electrode of the control transistor, the emitter electrode of the control transistor and the control resistor, and in which the output branch includes in order from an output terminal the collector electrode of the voltage amplitude control transistor, the emitter electrode of the voltage amplitude control transistor, the collector electrode of the current gain transistor, and the emitter electrode of the current gain transistor.

4. The transistor amplifier circuit in accordance with claim 4 in which the base electrode of the voltage amplitude control transistor is connected to the input branch at a point between the input series resistor and the collector electrode of the control transistor.

5. The transistor amplifier circuit in accordance with claim 5 in which the transistors are of the NPN-type, and the input and output terminals are adapted for application of a positive voltage and the common terminal is adapted for application of a negative voltage.

* * * * *

UNITED STATES PATENT OFFICE
CERTIFICATE OF CORRECTION

Patent No. 3,626,313 Dated December 7, 1971

Inventor(s) Paul Zuk

It is certified that error appears in the above-identified patent and that said Letters Patent are hereby corrected as shown below:

In the last sentence of the Abstract, after "and" second occurrence, and before "bypass" insert --a--.

Column 1, line 9, delete "is" and insert --in--;
line 29, delete "of" and insert --or--;
line 45, delete "it" and insert --its--.
Column 4, line 19, delete "of" and insert --if--;
line 65 and 66, after "collector" and before "of" insert --electrode--.
Claim 4, Columns 5 and 6, change "in accordance with claim 4" to --in accordance with claim 3--.
Claim 5, Column 6, change "in accordance with claim 5" to --in accordance with claim 4--.

Signed and sealed this 20th day of June 1972.

(SEAL)
Attest:

EDWARD M.FLETCHER,JR.
Attesting Officer

ROBERT GOTTSCHALK
Commissioner of Patents